(12) United States Patent
Horikiri et al.

(10) Patent No.: US 10,658,569 B2
(45) Date of Patent: *May 19, 2020

(54) METHOD FOR MANUFACTURING NIOBATE-SYSTEM FERROELECTRIC THIN-FILM DEVICE

(71) Applicants: SUMITOMO CHEMICAL COMPANY, LIMITED, Tokyo (JP); KANTO KAGAKU KABUSHIKI KAISHA, Tokyo (JP)

(72) Inventors: Fumimasa Horikiri, Hitachi (JP); Kenji Shibata, Hitachi (JP); Kazutoshi Watanabe, Hitachi (JP); Kazufumi Suenaga, Tokyo (JP); Masaki Noguchi, Tokyo (JP); Kenji Kuroiwa, Tokyo (JP)

(73) Assignees: SUMITOMO CHEMICAL COMPANY, LIMITED, Tokyo (JP); KANTO KAGAKU KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/217,455

(22) Filed: Dec. 12, 2018

(65) Prior Publication Data

US 2019/0115525 A1 Apr. 18, 2019

Related U.S. Application Data

(63) Continuation of application No. 15/548,543, filed as application No. PCT/JP2016/051389 on Jan. 19, 2016, now Pat. No. 10,199,564.

(30) Foreign Application Priority Data

Feb. 4, 2015 (JP) ................................. 2015-020309

(51) Int. Cl.
*H01L 41/316* (2013.01)
*H01L 41/187* (2006.01)
(Continued)

(52) U.S. Cl.
CPC ............ *H01L 41/316* (2013.01); *C23C 14/08* (2013.01); *C23C 14/34* (2013.01); *H01L 21/308* (2013.01);
(Continued)

(58) Field of Classification Search
None
See application file for complete search history.

(56) References Cited

U.S. PATENT DOCUMENTS 5,194,117 A  *  3/1993  Bindell ............... C04B 41/5361
                                              216/101
5,466,389 A     11/1995  Ilardi et al.
(Continued)

FOREIGN PATENT DOCUMENTS

EP        2843723 A1      3/2015
JP     2000-31133 A       1/2000
(Continued)

OTHER PUBLICATIONS

Japanese Office Action, dated Jan. 8, 2019, for Japanese Application No. 2015-064739, with an English machine translation.
(Continued)

*Primary Examiner* — Matthew L Reames
*Assistant Examiner* — John A Bodnar
(74) *Attorney, Agent, or Firm* — Birch, Stewart, Kolasch & Birch, LLP (57) ABSTRACT

This method for manufacturing a lead-free niobate-system ferroelectric thin film device includes: a lower electrode film formation step of forming a lower electrode film on a substrate; a ferroelectric thin film formation step of forming
(Continued)

a niobate-system ferroelectric thin film on the lower electrode film; an etch mask pattern formation step of forming an etch mask in a desired pattern on the niobate-system ferroelectric thin film; and a ferroelectric thin film etching step of shaping the niobate-system ferroelectric thin film into a desired fine pattern by wet etching using an etchant comprising: a predetermined chelating agent including at least one selected from EDTMP, NTMP, CyDTA, HEDP, GBMP, DTPMP, and citric acid; an aqueous alkaline solution containing an aqueous ammonia solution; and an aqueous hydrogen peroxide solution.

9 Claims, 6 Drawing Sheets

(51) Int. Cl.
    H01L 41/332    (2013.01)
    H01L 21/308    (2006.01)
    H01L 41/113    (2006.01)
    C23C 14/08     (2006.01)
    C23C 14/34     (2006.01)

(52) U.S. Cl.
    CPC .......... *H01L 41/113* (2013.01); *H01L 41/187* (2013.01); *H01L 41/1873* (2013.01); *H01L 41/332* (2013.01)

(56) References Cited

U.S. PATENT DOCUMENTS

| | | | |
|---|---|---|---|
| 6,411,464 | B1 | 6/2002 | Fujii et al. |
| 10,199,564 | B2 * | 2/2019 | Horikiri ................ C23C 14/08 |
| 2002/0092823 | A1 | 7/2002 | Gill et al. |
| 2004/0127044 | A1 * | 7/2004 | Verhaverbeke .......... B08B 3/04 |
| | | | 438/689 |
| 2005/0082584 | A1 | 4/2005 | Hussein et al. |
| 2008/0090369 | A1 | 4/2008 | Akiyama et al. |
| 2008/0284543 | A1 | 11/2008 | Taniguchi et al. |
| 2010/0112728 | A1 | 5/2010 | Korzenski et al. |
| 2010/0141099 | A1 | 6/2010 | Suenaga et al. |
| 2010/0320871 | A1 | 12/2010 | Suenaga et al. |
| 2012/0025667 | A1 | 2/2012 | Horikiri et al. |
| 2012/0056508 | A1 | 3/2012 | Horikiri et al. |
| 2012/0304429 | A1 | 12/2012 | Horikiri et al. |
| 2014/0339962 | A1 | 11/2014 | Furukawa et al. |
| 2015/0064804 | A1 | 3/2015 | Horikiri et al. |

FOREIGN PATENT DOCUMENTS

| | | |
|---|---|---|
| JP | 2000-281470 A | 10/2000 |
| JP | 2002-155382 A | 5/2002 |
| JP | 2005-142911 A | 6/2005 |
| JP | 2007-19302 A | 1/2007 |
| JP | 2010-161330 A | 7/2010 |
| JP | 2012-33693 A | 2/2012 |
| JP | 2012-244090 A | 12/2012 |
| JP | 2013-16776 A | 1/2013 |
| JP | 2013-102089 A | 5/2013 |
| JP | 2014-58988 A | 3/2014 |
| JP | 2014-60267 A | 4/2014 |
| JP | 2014-207393 A | 10/2014 |
| JP | 2015-53417 A | 3/2015 |

OTHER PUBLICATIONS

Japanese Office Action, dated Mar. 19, 2019, for Japanese Application No. 2015-064704, with an English machine translation.
Japanese Office Action, dated Mar. 19, 2019, for Japanese Application No. 2015-064726, with an English machine translation.
U.S. Office Action, dated Feb. 12, 2019, for U.S. Appl. No. 15/561,392.
Extended European Search Report European Application No. 16746410.6, dated Aug. 30, 2018.
Extended European Search Report for European Application No. 16768322.6, dated Aug. 24. 2018.
Extended European Search Report of European Application No. 16768324.2, dated Aug. 24, 2018.
Extended European Search Report for European Application No. 16768326.7, dated Oct. 1, 2018.
Extended European Search Report for European Application No. 16768627.8 dated Aug. 27, 2018.
Extended European Search Report for European Application No. 16772062.2, dated Oct. 1, 2018.
Horikiri et al., "Chelate-zai o Mochilta Dal Kokei Hien KNN Atsuden Hakumaku no Wet Etching (The Wet Etching Technique of KNN films by EDTA)", JSAP Spring Meeting Koen Yokoshu, Mar. 3, 2014, pp. 6-10 (including an English translation thereof).
International Search Report, issued in PCT/JP2016/051389, dated Apr. 12, 2016.

* cited by examiner

(a) CITRIC ACID 0.01 M
(b) CITRIC ACID 0.1 M
(c) CITRIC ACID 0.7 M

FIG. 7

(a) EDTMP 0.01 M + CITRIC ACID 0.1 M
(b) NTMP 0.01 M + CITRIC ACID 0.1 M
(c) HEDP 0.01 M + CITRIC ACID 0.1 M

FIG. 8

METHOD FOR MANUFACTURING NIOBATE-SYSTEM FERROELECTRIC THIN-FILM DEVICE

CROSS-REFERENCE TO RELATED APPLICATIONS

This application is a Continuation of co-pending application Ser. No. 15/548,543 filed on Aug. 3, 2017, which is a National Phase of PCT International Application No. PCT/JP2016/051389 filed on Jan. 19, 2016, which claims priority under 35 U.S.C. § 119(a) to Patent Application No. 2015-020309 filed in Japan on Feb. 4, 2015. All of the above applications are hereby expressly incorporated by reference into the present application.

TECHNICAL FIELD OF THE INVENTION

The present invention relates to technologies regarding ferroelectric thin film devices and particularly to methods for manufacturing lead-free niobate-system ferroelectric thin film devices.

DESCRIPTION OF BACKGROUND ART

Ferroelectrics are very attractive substances because of their peculiar characteristics (such as very high relative permittivity, and good pyroelectric, piezoelectric and ferroelectric properties). So, various devices (such as ceramic multilayer capacitors, pyroelectric devices, piezoelectric devices and ferroelectric memories) have been developed and put into use utilizing such peculiar properties. Typical ferroelectrics are perovskite materials such as barium titanate ($BaTiO_3$) and lead zirconate titanate ($Pb(Zr_{1-x}Ti_x)O_3$, PZT). Of these, lead zirconate titanates (PZTs) provide relatively excellent polarization and piezoelectric properties and are therefore most widely used.

Lead-containing PZTs are specified hazardous substances. However, because there are currently no suitable commercially available alternative pyroelectric or piezoelectric materials, PZTs are exempt from the RoHS directive (the directive on the restriction of the use of specified hazardous substances in electrical and electronic equipment enforced by the European Union and Council of Europe). However, with the growing worldwide responsibility towards global environment conservation, a strong demand exists for development of pyroelectric and piezoelectric devices using lead-free ferroelectric materials.

Also, with the recent trend toward smaller and lighter electronic devices, there is an increasing need for ferroelectric thin film devices in which a thin-film technology is utilized.

Herein, pyroelectric and piezoelectric thin film devices will be described below as representatives of such ferroelectric thin film devices. Piezoelectric devices utilize the piezoelectric effect of a ferroelectric material, and are widely used as functional devices such as actuators and stress sensors. Actuators generate a displacement or vibration in response to an applied voltage to a ferroelectric (piezoelectric) material. Stress sensors generate a voltage in response to a strain produced in a piezoelectric material. Pyroelectric devices detect light (including infrared light) utilizing the pyroelectric effect of a ferroelectric material, and are widely used as infrared human body sensors, etc.

Examples of piezoelectric devices utilizing a lead-free piezoelectric material are described below. Patent Literature 1 discloses a piezoelectric thin film device including, on a substrate, a lower electrode, a piezoelectric thin film and an upper electrode. The piezoelectric thin film is made of an alkali niobate-based perovskite dielectric material of a chemical formula $(Na_xK_yLi_z)NbO_3$ (where $0<x<1$, $0<y<1$, $0 \leq z<1$, and $x+y+z=1$). A buffer layer of a perovskite crystal structure material is formed between the piezoelectric thin film and the lower electrode. The perovskite buffer layer is highly preferentially (001), (100), (010) or (111) oriented. According to this Patent Literature 1, the piezoelectric thin film device utilizing the lead-free lithium potassium sodium niobate thin film exhibits sufficient piezoelectric properties.

Piezoelectric devices have a basic structure of a piezoelectric material sandwiched between two electrodes and are micro-fabricated into a beam shape or a tuning fork shape depending on their application. So, micro fabrication processes are important in order to put piezoelectric devices using lead-free piezoelectric materials to practical use.

Patent Literature 2 discloses a method of processing a wafer having thereon a piezoelectric thin film of a chemical formula $(K_{1-x}Na_x)NbO_3$ (where $0.4 \leq x \leq 0.7$). The method includes the first step of ion etching the piezoelectric thin film on wafer in an Ar gas atmosphere and the second step of reactive ion etching the resulting wafer in a fluorine based reactive gas/Ar mixture atmosphere. According to this Patent Literature 2, a fine pattern of the piezoelectric thin film can be formed, thereby providing a highly reliable and low cost piezoelectric thin film device.

Patent Literature 3 discloses a method for manufacturing a piezoelectric film device, which includes the steps of: forming a lower electrode on a substrate; forming, on the lower electrode, a piezoelectric film of an alkali niobate-based perovskite material represented by a chemical formula $(K_{1-x}Na_x)NbO_3$; and wet-etching the piezoelectric film using a hydrogen fluoride-based etchant and a Cr film etch mask. According to this Patent Literature 3, the Cr mask and the lower electrode are not etched by the hydrogen fluoride-based etchant; therefore, the piezoelectric film alone can be selectively etched. Thus, a fine pattern of the piezoelectric film can be accurately formed in a short time.

CITATION LIST

Patent Literature

Patent Literature 1: JP 2007-019302 A
Patent Literature 2: JP 2012-033693 A
Patent Literature 3: JP 2012-244090 A

SUMMARY OF THE INVENTION

Problems to be Solved by the Invention

As described above, niobate-based ferroelectric materials (such as potassium sodium niobate $((K_{1-x}Na_x)NbO_3)$ are very promising as lead-free ferroelectric materials. In order to put thin film devices using niobate-based ferroelectric materials as alternatives for PZTs to practical use and mass production, it is very important to develop and establish techniques for micro-fabricating niobate-based ferroelectric thin film devices with a high dimensional accuracy and at low cost.

However, niobate-based ferroelectric materials are relatively new materials, and their micro fabrication techniques are still under development. In these respects, the above-disclosed manufacturing techniques have the following disadvantages: The dry etching technique of the above Patent Literature 2 would achieve a high dimensional accuracy.

However, this dry etching technique requires an expensive etching apparatus because it is a vacuum process. In addition, the technique has only a relatively low throughput.

The wet etching technique of the above Patent Literature 3 would achieve a relatively high throughput and therefore have an advantage over dry etching processes in terms of manufacturing cost. However, niobate-based ferroelectric materials are chemically stable and are therefore difficult to fine-etch using an etchant other than hydrogen fluoride-based etchants. Hydrogen fluoride-based etchants require very careful handling for safety reasons and the usable etch masks are limited. These disadvantages increase the manufacturing cost and therefore might impair or offset the above-mentioned manufacturing cost advantage.

In view of the foregoing, it is an objective of the present invention to solve the above problems and provide a method for micro-fabricating a ferroelectric thin film device utilizing a lead-free niobate-system ferroelectric material with a high dimensional accuracy and at lower than conventional cost.

Solution to Problems

According to one aspect of the present invention, a method for manufacturing a niobate-system ferroelectric thin film device includes a lower electrode film formation step, a ferroelectric thin film formation step, an etch mask pattern formation step, and a ferroelectric thin film etching step. In the lower electrode film formation step, a lower electrode film is formed on a substrate. In the ferroelectric thin film formation step, a niobate-system ferroelectric thin film is formed on the lower electrode film. In the etch mask pattern formation step, an etch mask is formed in a desired pattern on the niobate-system ferroelectric thin film. In the ferroelectric thin film etching step, the niobate-system ferroelectric thin film is shaped into a desired fine pattern by wet etching using an etchant containing a predetermined chelating agent, an aqueous alkaline solution, and an aqueous hydrogen peroxide solution (referred to $H_2O_2$ aq.). The predetermined chelating agent contains at least one selected from ethylenediamine tetra(methylene phosphonic acid) (referred to EDTMP), nitrilotris(methylene phosphonic acid) (referred to NTMP), cyclohexane diamine tetraacetic acid (referred to CyDTA), 1-hydroxyethane-1,1-diphosphonic acid(etidronic acid) (referred to HEDP), glycine-N,N-bis (methylene phosphonic acid) (referred to GBMP), diethylenetriamine penta(methylene phosphonic acid) (referred to DTPMP), and citric acid. The aqueous alkaline solution contains an aqueous ammonia solution (referred to $NH_3$ aq.).

In the above aspect of the invention, the following modifications and changes can be made.

(i) When the predetermined chelating agent is EDTMP, NTMP, CyDTA, HEDP, GBMP or DTPMP, the chelating agent in the etchant may have a molarity of 0.001 M (mol/L) or more and 0.5 M (mol/L) or less. When the predetermined chelating agent is citric acid, the citric acid in the etchant may have a molarity of 0.03 M or more and 1 M or less.

(ii) The etch mask may be made of a silicon oxide film.

(iii) At the ferroelectric thin film etching step, the etchant may have a temperature of 50° C. or higher and lower than 100° C.

(iv) The niobate-system ferroelectric thin film may be made of potassium sodium niobate $((K_{1-x}Na_x)NbO_3$, referred to KNN) or lithium niobate ($LiNbO_3$, referred to LN).

(v) The lower electrode film may be made of platinum (Pt).

(vi) The niobate-system ferroelectric thin film has a device-forming surface on which the niobate-system ferroelectric thin film device is formed; the niobate-system ferroelectric thin film may include one or more crystal grains having a crystal system and crystal planes including a (001) crystal plane; the crystal system of the niobate-system ferroelectric thin film may be pseudo cubic or tetragonal; the niobate-system ferroelectric thin film may be formed by sputtering in such a manner that the (001) crystal plane of the one or more crystal grains is preferentially oriented parallel to the device-forming surface.

(vii) The substrate may be a silicon substrate having a thermal oxide layer thereon.

(viii) The method may further comprise: an upper electrode formation step of forming an upper electrode over a desired fine pattern of the niobate-system ferroelectric thin film; and a dicing step of dicing the substrate having thereon the niobate-system ferroelectric thin film having thereon the upper electrode into one or more chips.

Advantages of the Invention

According to the present invention, it is possible to wet etch a lead-free niobate-system ferroelectric thin film into a desired fine pattern with a high dimensional accuracy and at a lower cost than before. As a result, it is possible to provide a niobate-system ferroelectric thin film device in which a desired fine pattern of the ferroelectric thin film is formed at low manufacturing cost.

DETAILED DESCRIPTION OF THE PREFERRED EMBODIMENTS

The present inventors focused on niobate-system (niobate-based) ferroelectric materials [specifically, potassium sodium niobate ($(K_{1-x}Na_x)NbO_3$, KNN) and lithium niobate ($LiNbO_3$, LN)] as lead-free ferroelectric materials that were expected to have pyroelectric or piezoelectric properties comparable to those of lead zirconate titanates (Pb($Zr_{1-x}Ti_x$)$O_3$, PZT), and intensively investigated wet etching techniques usable for the niobate-system ferroelectric materials focused. After various investigations, the following results were obtained. Niobate-system ferroelectric materials are conventionally thought to be difficult to fine-etch using an etchant other than hydrogen fluoride-based etchants. However, niobate-system ferroelectric materials can be wet-etched using novel etchants containing a predetermined chelating agent, an aqueous alkaline solution and an aqueous hydrogen peroxide solution with high dimensional accuracy. In addition, silicon oxide films can be used as an etch mask because the new etchants do not contain hydrogen fluoride.

Chelating agents are thought to be less harmful to the human body and environment. So, simpler and less inexpensive etching apparatuses can be used, thus considerably reducing manufacturing and equipment cost. Further, because cheap and commonly used silicon oxide films can be used as an etch mask, the etching process using this new etchant is simplified, thus considerably reducing manufacturing process cost. The present invention is based on these new findings.

Preferred embodiments of the present invention will be described below with reference to the accompanying drawings. Hereinafter, the invention will be described using mainly KNN as the niobate-system ferroelectric material. However, the invention is not limited to the specific embodiments described below, but various combinations and modifications are possible without departing from the spirit and scope of the invention.

Figure 1:
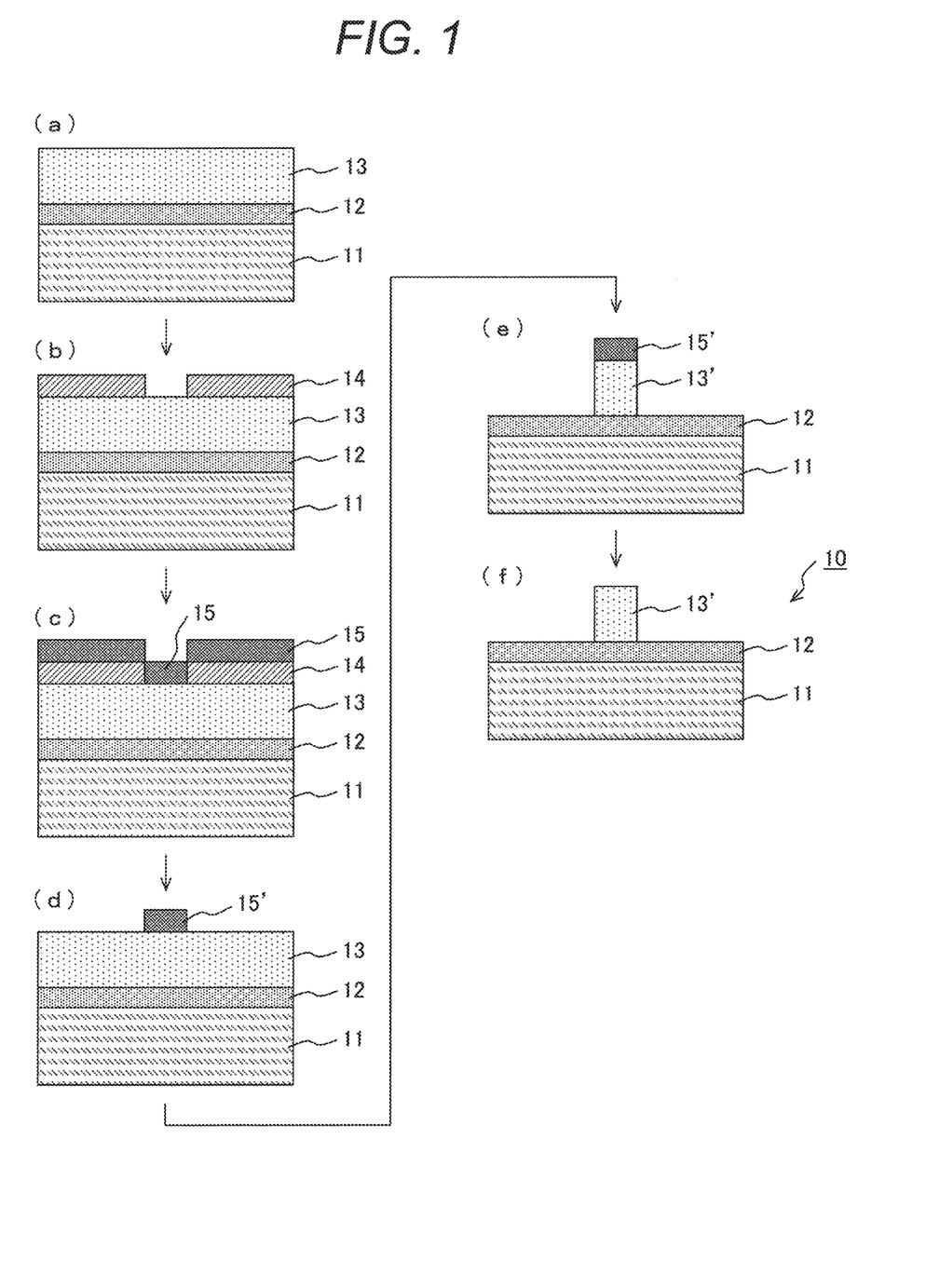
FIG. 1 is a schematic illustration showing an enlarged cross sectional view of manufacturing steps (from a first step to a ferroelectric thin film etching step) of a niobate-system ferroelectric thin film device according to the present invention.

FIG. 1 is a schematic illustration showing an enlarged cross sectional view of first half manufacturing steps (from a first step to a ferroelectric thin film etching step) of a niobate-system ferroelectric thin film device according to the invention. While a cleaning step and a drying step are not described below, it is preferable that these steps are performed as needed.

First, a substrate 11 is prepared. A material of the substrate 11 is not particularly limited, and may be properly selected based on applications of the pyroelectric or piezoelectric device. For example, silicon (Si), SOI (Silicon on Insulator), quartz glass, gallium arsenide (GaAs), sapphire ($Al_2O_3$), metal (such as stainless steel), magnesium oxide (MgO), and strontium titanate ($SrTiO_3$) may be used. When an electrically conductive material is used as the substrate 11, its surface is preferably covered with an electrical insulating film (e.g. an oxide film). There is no particular limitation on a method of forming the oxide film. For example, thermal oxidation and chemical vapor deposition (CVD) are suitable.

(Lower Electrode Film Formation Step)

At this lower electrode film formation step, a lower electrode film 12 is formed on the substrate 11 (see FIG. 1(a)). There is no particular limitation on a material of the lower electrode film 12; however, platinum (Pt) and an alloy mainly containing platinum are preferable. Because Pt is inert to an etchant used in a later-described ferroelectric film etching step, Pt can be used as an etch stop. There is no particular limitation on a method for forming the lower electrode film 12. For example, sputtering is suitable. The arithmetic mean surface roughness (Ra) of the lower electrode film 12 is preferably 0.86 nm or less in order to achieve sufficient pyroelectric (or piezoelectric) performance of a later-formed niobate-system ferroelectric thin film 13.

(Ferroelectric Thin Film Formation Step)

At this ferroelectric thin film formation step, the niobate-system ferroelectric thin film 13 is formed on the lower electrode film 12 (see FIG. 1(a)). KNN (($K_{1-x}Na_x$)$NbO_3$, 0.4≤x≤0.7) is preferable as a material of the niobate-system ferroelectric thin film 13. Sputtering (with a use of a sintered KNN target) and electron beam deposition are preferable as a method for forming the niobate-system (KNN) ferroelectric thin film 13. This is because sputtering and electron beam deposition are excellent in terms of reproducibility, formation rate, running cost and orientation control of KNN crystal films. Preferably, in order to achieve sufficient pyroelectric (or piezoelectric) performance, a crystal system of the niobate-system (KNN) ferroelectric thin film 13 is pseudo cubic or tetragonal and the (001) crystal plane is preferentially oriented parallel to a device forming surface.

The KNN thin film 13 may contain, as impurities, lithium (Li), tantalum (Ta), antimony (Sb), calcium (Ca), copper (Cu), barium (Ba) and titanium (Ti) in a total amount of 5 atomic percent or less.

LN ($LiNbO_3$) is also preferable as a material of the niobate-system ferroelectric thin film 13 for the same reason as described above for KNN.

(Etch Mask Formation Step)

At this etch mask formation step, an etch mask used for later-described wet etching is formed on the ferroelectric thin film 13. First, a photoresist pattern 14 is formed on the ferroelectric thin film 13 using a photolithography process (see FIG. 1(b)). Next, an unpatterned etch mask film 15 is formed over the photoresist pattern 14 (see FIG. 1(c)). Then, a desired etch mask pattern 15' is formed using a lift-off process (see FIG. 1(d)).

There is no particular limitation on a material of the etch mask layer 15 (etch mask pattern 15') so long as it has a sufficient resistance to later-described etchants. For example, a sputtered noble metal film (such as Au, Pt and Pd) and an oxide film (such as silicon oxide) are suitable. Of these materials, a silicon oxide film (e.g. $SiO_2$ film) is particularly preferable in view of the ease of use and the low cost. The etch mask pattern 15' may be formed using a process other than the above-described photolithography/lift-off process.

(Ferroelectric Thin Film Etching Step)

At this ferroelectric thin film etching step, the niobate-system ferroelectric thin film 13 is wet etched to form a fine pattern defined by the etch mask pattern 15'. The etchant used at this step preferably contains a chelating agent, an aqueous alkaline solution and an aqueous hydrogen peroxide solution and does not contain hydrogen fluoride (i.e., not containing fluorine ions). The use of such a hydrogen fluoride-free etchant reduces the safety cost conventionally needed to use hydrogen fluoride-based etchants.

The etchant will be more specifically described hereinafter. For the chelating agent, at least one selected from EDTMP (ethylenediamine tetra(methylene phosphonic acid)), NTMP (nitrilotris(methylene phosphonic acid)), CyDTA (cyclohexane diamine tetraacetic acid), HEDP (1-hydroxyethane-1,1-diphosphonic acid(etidronic acid)), GBMP (glycine-N,N-bis(methylene phosphonic acid)), DTPMP (diethylenetriamine penta(methylene phosphonic acid)), and citric acid may be preferably used.

When the predetermined chelating agent is EDTMP, CyDTA, NTMP, HEDP, GBMP, or DTPMP, the molarity of the chelating agent in the etchant is preferably 0.001 M (mol/L) or more and 0.5 M (mol/L) or less, more preferably 0.003 M or more and 0.3 M or less, and even more preferably 0.01 M or more and 0.2 M or less. When the molarity of the chelating agent is less than 0.001 M, the etching reaction activity is insufficient. When it exceeds 0.5 M, the etching reaction activity decreases.

Also, when the chelating agent is citric acid, the molarity of the citric acid in the etchant is preferably 0.03 M (mol/L) or more and 1 M (mol/L) or less, more preferably 0.05 M or more and 0.7 M or less, and even more preferably 0.1 M or more and 0.6 M or less. When the molarity of the citric acid is less than 0.03 M, the etching reaction activity is insufficient. When it exceeds 1 M, the etching reaction activity decreases.

For the solvent for the chelating agent, an aqueous alkaline solution and an $H_2O_2$ aq. are preferably used. For the aqueous alkaline solution, an $NH_3$ aq., an aqueous sodium hydroxide solution (NaOH aq.) and an aqueous potassium hydroxide solution (KOH aq.) may be used. However, it preferably contains mainly $NH_3$ aq.

The etchant is prepared so as to have a hydrogen ion exponent (potential of hydrogen: pH) of preferably 7.5 or more and 12 or less, more preferably 8 or more and 10 or less. When the pH is less than 7.5, the etching reaction activity is insufficient. When it exceeds 10, the etching reaction activity begins to decrease. When it exceeds 12, the etching reaction activity further decreases and becomes saturated.

When an $NH_3$ aq. is used for the aqueous alkaline solution, the $NH_3$ concentration is preferably 3 M (mol/L) or more and 10 M (mol/L) or less, for example. The pH may be adjusted by adding a strong acid (e.g. hydrochloric acid) or a strong base (e.g. sodium hydroxide and potassium hydroxide).

The concentration of the $H_2O_2$ aq. is preferably 4 M (mol/L) or more and 9 M (mol/L) or less, more preferably 5 M or more and 8 M or less. When the $H_2O_2$ concentration is less than 4 M, the etching reaction activity is insufficient. When it exceeds 9 M, preparation of the etchant is difficult.

As the individual chemicals that constitute the etchant, commercially available reagents may be used. Also, the etchant to be used is preferably prepared immediately before the wet-etching process.

When the etchant is prepared, particularly when it is prepared in a relatively large amount (e.g. 2 L or more), it is prepared preferably by a two-liquid mixing system in which a separately prepared concentrated solution containing the chelating agent and an $NH_3$ aq. (chelating agent/ ammonia concentrated solution) is diluted and mixed with an $H_2O_2$ aq. The chelating agent/ammonia concentrated solution is excellent in preservability and therefore can be prepared in advance.

Preparation of the etchant by the two-liquid mixing system makes it possible to prepare a required amount of etchant immediately before the wet-etching process in an extremely short time, thereby significantly reducing the time that is required to complete the entire etching process (resulting in a further reduced process cost).

The $SiO_2$ etch mask pattern 15' and the lower electrode film 12 (Pt or Pt alloy) are inert (resistant) to the above-described etchants; thus, the niobate-system ferroelectric thin film pattern 13' (which is a desired fine pattern of the niobate-system ferroelectric thin film 13) can be formed (see FIG. 1(e)). The etching reaction activity can be enhanced by raising the etching temperature (etchant temperature) from a room temperature to a higher temperature. The etchant temperature is preferably 50° C. or higher, more preferably 60° C. or higher and even more preferably 80° C. or higher. However, in view of operational safety, the etchant temperature is preferably lower than 100° C.

The etching reaction mechanism of the invention is not fully clarified. But, the chelating agent and the hydrogen peroxide by coexisting with each other would react with niobium to form a chemically very stable chelate peroxide (e.g. Nb—$H_2O_2$-EDTMP), which is probably effective in etching the niobate-system ferroelectric thin film 13.

After the above-described wet etching, the etch mask pattern 15' is removed using an etchant for silicon oxide (e.g. buffered HF); thereby, a ferroelectric thin film-on-substrate 10 having a desired fine pattern of the niobate-system ferroelectric thin film 13 (the niobate-system ferroelectric thin film pattern 13') is formed (see FIG. 1(f)).

(Upper Electrode Formation Step)

Figure 2:
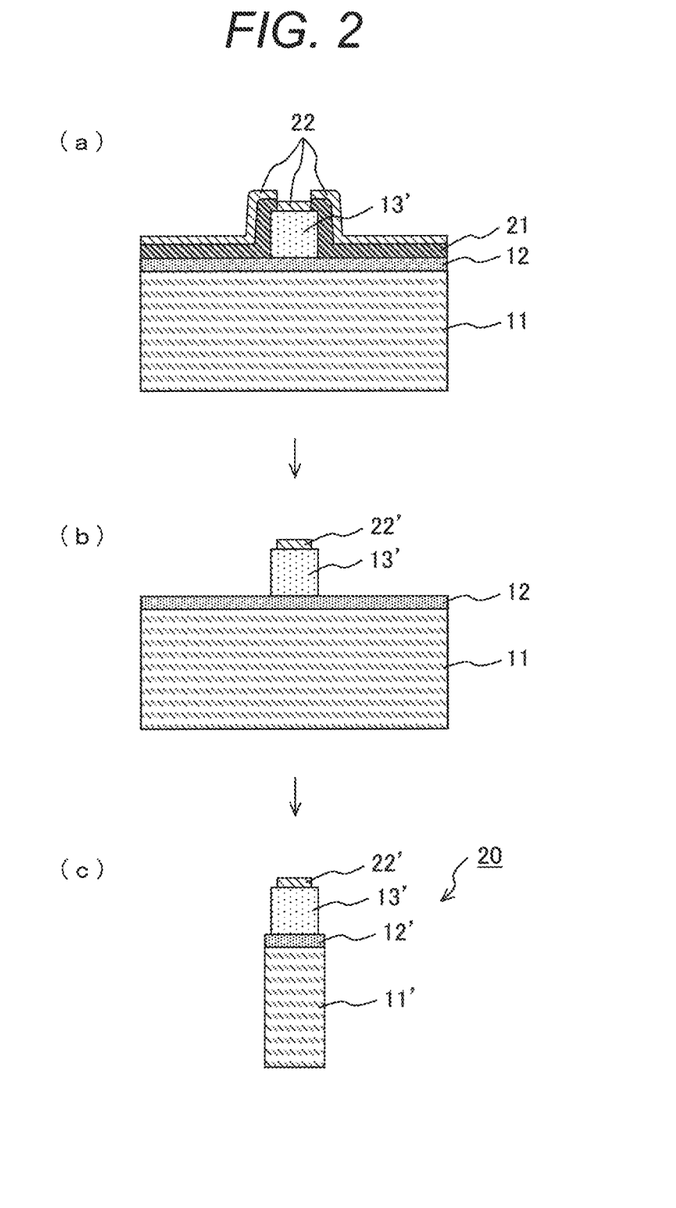
FIG. 2 is a schematic illustration showing an enlarged cross sectional view of manufacturing steps (from a ferroelectric thin film etching step to a final step) of a niobate-based ferroelectric thin film device according to the invention.

FIG. 2 is a schematic illustration showing an enlarged cross sectional view of latter half manufacturing steps (from a ferroelectric thin film etching step to a final step) of the niobate-system ferroelectric thin film device according to the invention. At this upper electrode formation step, an upper electrode is formed on the niobate-system ferroelectric thin film having a desired fine pattern (niobate-system ferroelectric thin film pattern 13'). First, a photoresist pattern 21 (corresponding to the reverse (negative) pattern of a later-formed upper electrode 22') is formed using a photolithography process. Then, an upper electrode film 22 is formed over the photoresist pattern 21 (see FIG. 2(a)). Next, the area other than an upper electrode 22' is removed using a lift-off process (see FIG. 2(b)). Suitable materials of the upper electrode film 22 (upper electrode 22') are, for example, aluminum (Al), gold (Au), nickel (Ni) and Pt.

(Dicing Step)

At this dicing step, the substrate having the niobate-system ferroelectric thin film pattern 13' and the upper electrode 22' is diced into a chip of a niobate-system ferroelectric thin film device 20 (see FIG. 2(c)). Meanwhile, the reference numeral 11' designates the diced substrate of the chip 20 and numeral 12' designates the lower electrode in the chip 20. Thus, the formation of the niobate-system ferroelectric thin film device chip 20 having thereon a desired fine pattern of the niobate-system ferroelectric thin film is completed. There is no particular limitation on the timing of the dicing step, and it may be performed at a time that is deemed appropriate in terms of optimization of the entire manufacturing process.

EXAMPLES

The present invention will be described more specifically below by way of examples. However, the invention is not limited to the specific examples below.

Examination 1

[Potassium Sodium Niobate (KNN) Thin Film Device]

(Fabrication of KNN Thin Film-On-Substrate)

The KNN thin film-on-substrate 10 was fabricated according to the manufacturing steps illustrated in FIG. 1. A 4-inch (100) Si wafer with thermal oxide (Si wafer thickness of 0.525 mm; oxide thickness of 200 nm) was used as the substrate 11.

First, a 2.2-nm thick Ti layer was formed on the substrate 11 by RF magnetron sputtering in order to enhance adhesion between the substrate 11 and the lower electrode film 12. Next, the lower electrode film 12 was formed by forming a 205-nm thick Pt layer on the Ti layer by RF magnetron sputtering (see FIG. 1(a)). The sputtering conditions for the Ti adhesive layer and Pt lower electrode film 12 were as follows: targets of pure Ti (for the Ti layer) and pure Pt (for the Pt electrode); substrate temperature of 250° C.; discharge power of 200 W; sputtering gas of Ar; and pressure of 2.5 Pa.

The measured arithmetic mean surface roughness of the thus formed lower electrode film 12 was 0.86 nm or less. The sputtering was carried out using a RF sputtering machine (SH-350-T10, available from ULVAC, Inc.) (the same machine was used in all the remaining sputtering processes described below).

After the formation of the Pt lower electrode film 12, the niobate-system ferroelectric thin film 13 was formed by forming approximately a 1.9-μm thick KNN (($K_{0.35}Na_{0.65}$)$NbO_3$) thin film on the lower electrode film 12 by RF magnetron sputtering (see FIG. 1(*a*)). The sputtering condition for the KNN thin film 13 was as follows: target of sintered ($K_{0.35}Na_{0.65}$)$NbO_3$; substrate temperature of 400 to 600° C.; discharge power of 700 to 800 W; sputtering gas of $O_2$/Ar mixture ($O_2$/Ar ratio=0.005); and pressure of 0.3 to 1.3 Pa.

(Etching Testing)

Next, a photoresist pattern 14 was formed on the KNN thin film 13 formed above by applying, exposing and developing a photoresist (OFPR-800, available from TOKYO OHKA KOGYO CO., LTD.) (see FIG. 1(*b*)). Then, as an etch mask layer 15, an $SiO_2$ film having a thickness of 300 nm was formed by plasma CVD using a tetraethoxysilane (TEOS) material (see FIG. 1(*c*)). Subsequently, the photoresist pattern 14 was removed or lifted off using a resist removing liquid (JELK series, available from Kanto Chemical Co., Inc.) to form an etch mask pattern 15' on the KNN thin film 13 (see FIG. 1(*d*)).

Etching test pieces (6 mm×9 mm) were cut out from the thus fabricated substrate having thereon the KNN thin film 13 and the etch mask pattern 15'. Then, the KNN thin film pattern 13' was formed on each etching test piece by wet etching using a different test etchant and a different etching condition (see FIGS. 1(*e*) and 1(*f*)).

Various etchants were prepared from predetermined chelating agents, an $NH_3$ aq. (made by Kanto Chemical Co., Inc., reagent grade, content: 29%), and an $H_2O_2$ aq. (made by Kanto Chemical Co., Inc., reagent grade, content: 35%). The predetermined chelating agents used were EDTMP (made by Chelest Corporation, purity: 90% or higher), NTMP (made by Tokyo Chemical Industry Co., Ltd., purity: 50% or higher), cyclohexane diamine tetraacetic acid monohydrate (CyDTA.$H_2O$, made by Chelest Corporation), HEDP (Chelest Corporation, purity: 60% or higher), GBMP (made by Tokyo Chemical Industry Co., Ltd., purity: 97% or higher), DTPMP (made by Italmatch Japan Ltd., Dequest® 2060S), and citric acid monohydrate (made by Kanto Chemical Co., Ltd., purity: 99.5% or higher).

Also, as a reference etchant, an etchant containing ethylene diamine tetraacetic acid (EDTA, made by Wako Pure Chemical Industries, Ltd., for reagent research, purity: 99.5%) as the chelating agent was prepared referring to a presentation given at an academic lecture meeting (see the proceedings, 19a-D1-10, of the 74th Japan Society of Applied Physics Autumn Meeting, held in autumn 2013 at Doshisha University).

(Evaluation of Etching Performance)

(1) Etching Rate

A relationship between the etching rate and the etching temperature (etchant temperature) was studied. As the etchant, a mixture of 0.1 M of a chelating agent, 3.5 M of an $NH_3$ aq., and 7.5 M of an $H_2O_2$ aq. was used. The initial pH of the etchant was 9.6 to 9.7. The etchant temperature was 70 to 95° C.

Figure 3:
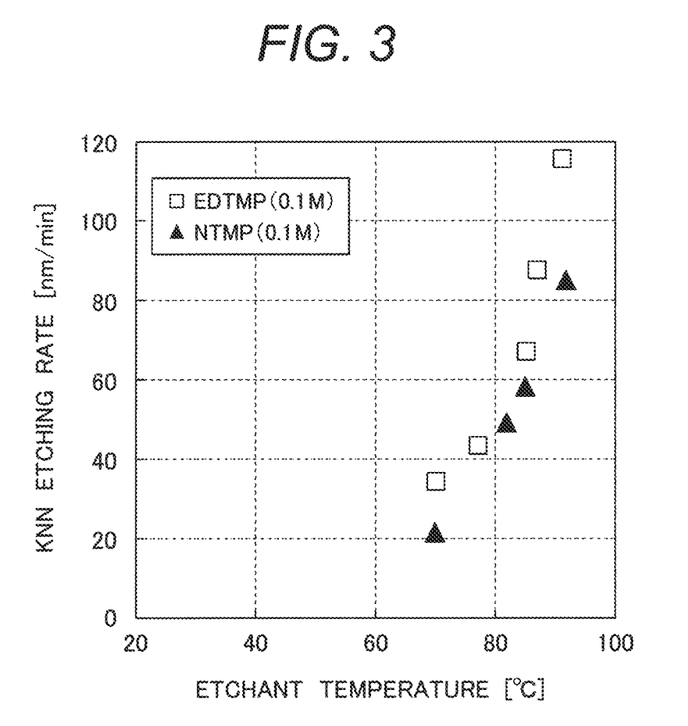
FIG. 3 is a graph showing exemplary relationships between etching rate and etchant temperature.

FIG. 3 is a graph showing exemplary relationships between the etching rate and the etchant temperature. As shown in FIG. 3, it is observed that with the etchant containing EDTMP as the chelating agent and the etchant containing NTMP as the chelating agent, the etching rate increases with increasing the etchant temperature (etching temperature). Also, it was separately observed that similar results were obtained with the etchants containing other chelating agents.

Table 1 shows relationships between each chelating agent and the etching rate when the chelating agent concentration was 0.1 M, and the etchant temperature was 85° C. (85±1° C.). As seen from Table 1, it is observed that a sufficiently high etching rate is achieved with each chelating agent. It is also observed that the etchant according to the present invention exhibits an etching rate that is comparable to or higher than that of the reference etchant containing EDTA.

TABLE 1

Relationships between Each Chelating Agent and Etching Rate (chelating agent concentration of 0.1M, and etchant temperature of 85° C.).

| Chelating Agent (0.1M) | Etchant Temperature | Etching Rate (nm/min) |
|---|---|---|
| EDTMP | 85° C. | 67 |
| NTMP | | 58 |
| CyDTA | | 64 |
| HEDP | | 63 |
| GBMP | | 56 |
| DTPMP | | 55 |
| Citric Acid | | 55 |
| EDTA | | 45 |

Herein, the etching rate that is acceptable in terms of mass production efficiency will be briefly discussed. A typical etching rate in a conventional dry-etching process ranges from 10 to 40 nm/min. On the other hand, the etching process according to the present invention is a wet-etching process and is capable of simultaneously etching far more workpieces than a dry-etching process. Assume that it simultaneously etches 10 times as many workpieces as those that can be handled by a single dry-etching machine. Then its throughput in manufacturing is equivalent to that of a dry-etching process with a 10 times higher etching rate. Therefore, even if the etching rate of the etching process according to the invention is equivalent to that of a typical dry-etching process, the invention has a sufficient advantage in terms of mass production efficiency. In other words, an etching rate of 10 nm/min or higher is enough to sufficiently contribute to manufacturing cost reduction.

(2) Concentration of Chelating Agent

Influences of the concentration of the chelating agent in the etchant on the etching performance were studied. The etching performance on the KNN thin film was evaluated with the concentration of each chelating agent varied in a range from 0.0001 to 1.2 M. The concentration of the $NH_3$ aq. and the concentration of the $H_2O_2$ aq. were the same as those of the above-described etchant (3.5 M and 7.5 M, respectively). The etchant temperature was 85 to 90° C., and the etching time was 30 minutes. The etching time of 30 minutes was estimated, based on the results of the etching testing above, to be a time required for the KNN thin film 13 having a thickness of approximately 1.9 μm to be sufficiently etched off to expose the lower electrode film 12 (herein, Pt film).

After the 30-minute etching process, each test piece was taken out and subjected to water washing and drying. Subsequently, the test piece was fractured and the fractured surface was observed with a scanning electron microscopy (SEM). The results are shown in FIGS. 4 to 7.

Figure 4:
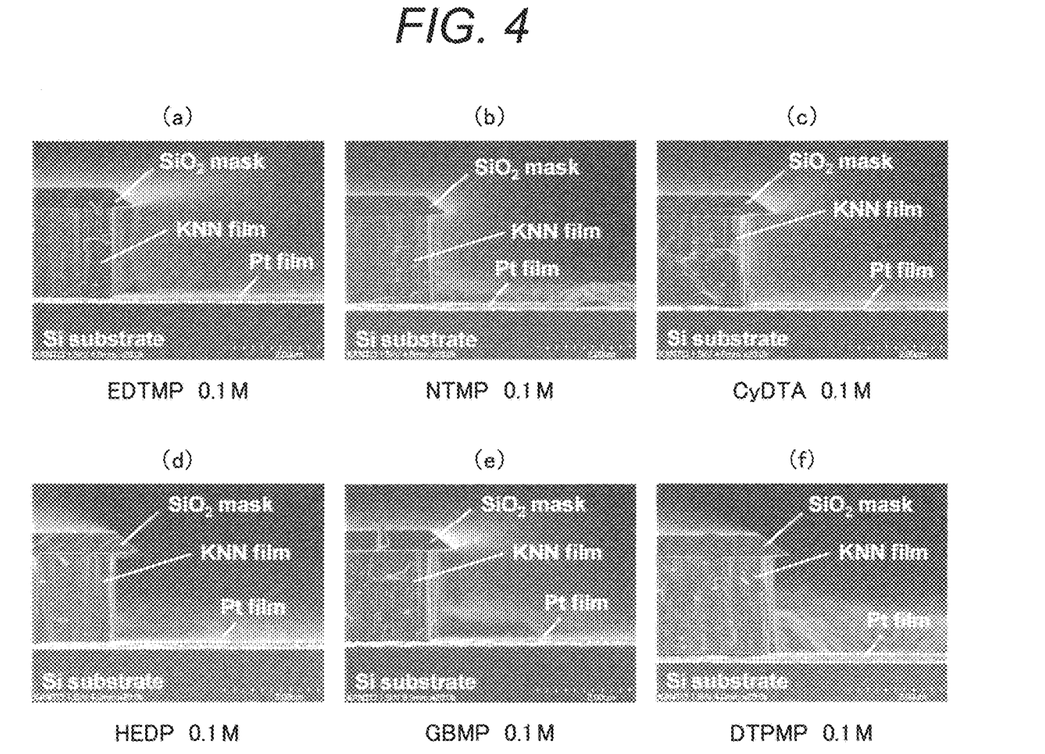
FIG. 4 shows scanning electron microscopy (SEM) images showing exemplary etching results when concentration of each chelating agent is 0.1 M.

FIG. 4 shows SEM images showing exemplary etching results when the concentration of each chelating agent is 0.1 M. As shown in FIG. 4 (FIGS. 4(a)-4(f)), it is observed that the KNN thin film 13 is sufficiently etched off by the 30-minute etching with each chelating agent.

Figure 5:
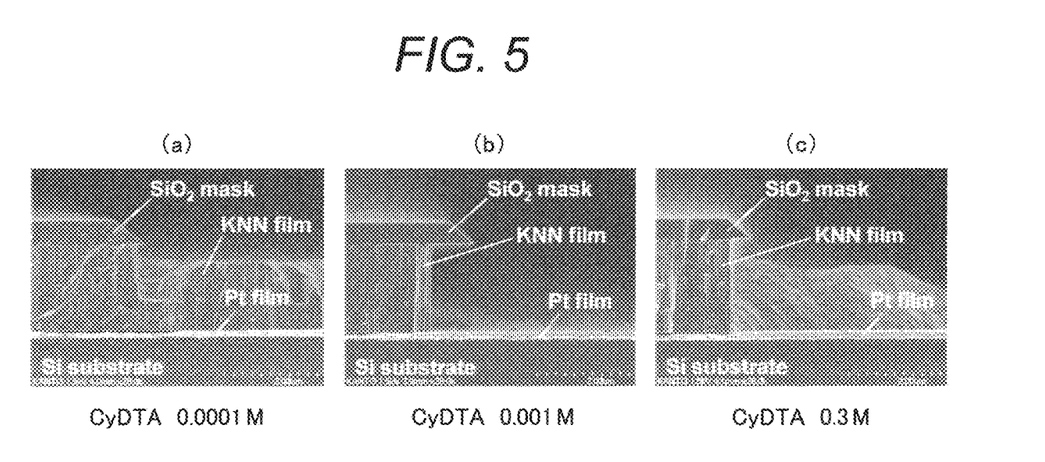
FIG. 5 shows SEM images showing exemplary etching results when CyDTA is used as a chelating agent.

FIG. 5 shows SEM images showing exemplary etching results when CyDTA is used as the chelating agent. As shown in FIG. 5 (FIGS. 5(a)-5(c)), the etching rate achieved with a CyDTA concentration of 0.0001 M on FIG. 5(a) is insufficient. In contrast, it is observed that a sufficient etching rate is achieved with a CyDTA concentration ranging from 0.001 to 0.5 M (see FIGS. 5(b) and 5(c)). However, the etching rate decreased clearly with a CyDTA concentration of 0.7 M. Also, it was separately observed that results similar to those with CyDTA were obtained when the chelating agent was EDTMP, NTMP, HEDP, GBMP, or DTPMP.

Figure 6:
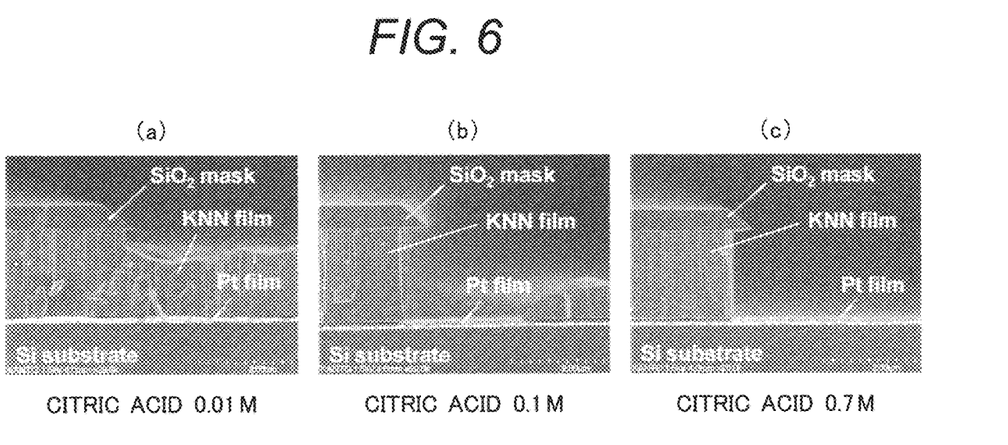
FIG. 6 shows SEM images showing exemplary etching results when citric acid is used as the chelating agent.

FIG. 6 shows SEM images showing exemplary etching results when citric acid is used as the chelating agent. As shown in FIG. 6 (FIGS. 6(a)-6(c)), the etching rate achieved with a citric acid concentration of 0.01 M on FIG. 6(a) is insufficient. Meanwhile, it is observed that a sufficient etching rate is achieved with a citric acid concentration ranging from 0.03 to 1 M (see FIGS. 6(b) and 6(c)). However, the etching rate decreased clearly with a citric acid concentration of 1.2 M.

Figure 7:
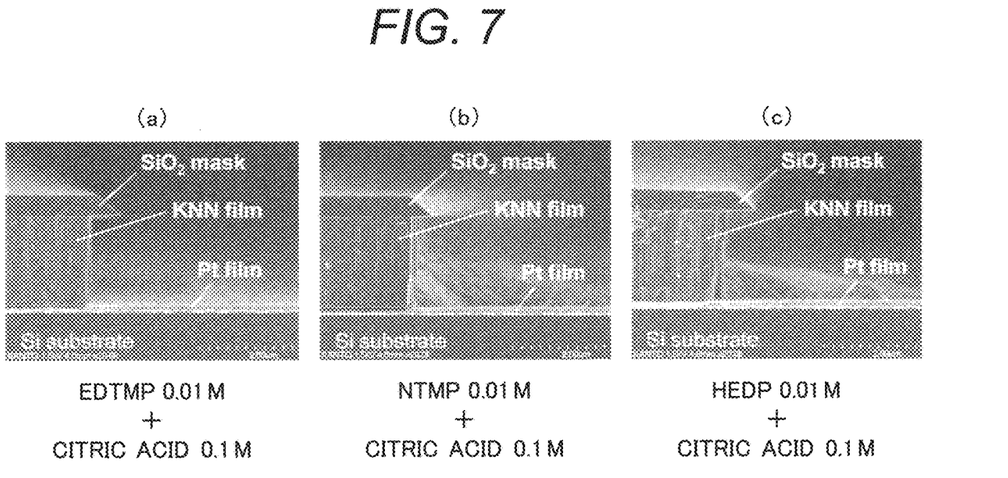
FIG. 7 shows SEM images showing exemplary etching results when a plurality of chelating agents are used in combination.

FIG. 7 shows SEM images showing exemplary etching results when a plurality of chelating agents are used in combination. As shown in FIG. 7 (FIGS. 7(a)-7(c)), it is observed that a sufficient etching rate is achieved with a combination of "EDTMP+citric acid", a combination of "NTMP+citric acid", and a combination of "HEDP+citric acid". Also, it was separately observed that results similar to those shown in FIGS. 7(a)-7(c) were achieved with other combinations of chelating agents.

As seen from the results of FIGS. 4 to 7, it is revealed that the chelating concentration in the etchant had little influence on the etching rate.

(3) Hydrogen Ion Exponent (Potential of Hydrogen)

Influences of the hydrogen ion exponent (pH) of the etchant on the etching performance were studied. The pH adjustment was made by controlling the ammonia ($NH_3$) concentration, the hydrochloric acid (HCl) concentration, and the sodium hydroxide (NaOH) concentration. The other components of the etchant were 0.1 M of EDTMP and 7.5 M of an $H_2O_2$ aq. It was observed that the pH had the least influence on the etching rate at 8 to 10 and that the etching rate decreased clearly with a pH less than 7.5 or more than 12.

(4) Concentration of Hydrogen Peroxide ($H_2O_2$)

Influences of the $H_2O_2$ concentration in the etchant on the etching performance were studied. The other components of the etchant was 0.1 M of EDTMP and 3.5 M of an $NH_3$ aq. It was observed that the $H_2O_2$ concentration had the least influence on the etching rate at 4 to 9 M and that the etching rate decreased clearly with an $H_2O_2$ concentration less than 4 M.

(5) Etching Accuracy

As shown in FIGS. 4 to 7, it is observed that wet etching of the invention to the KNN thin film 13 is extremely neatly and accurately performed with an $SiO_2$-based etch mask. The amount of side etching is approximately 20 to 40% of the film thickness. Also, an examination of the etching selectivity ratio of the "KNN thin film"/"$SiO_2$-based etch mask" by using some of the etching test pieces revealed that the etching selectivity ratio was 60 or higher. In addition, it was confirmed that no etching or peeling occurred in the Pt film, to serve as the lower electrode, which means that the lower electrode film 12 can be used as an etching stopper.

(Fabrication of Piezoelectric Thin Film Device)

According to the manufacturing steps shown in FIG. 2, the photoresist pattern 21 was formed over the KNN thin film pattern 13' patterned by the above-described invention's wet etching process. Then, a 100-nm thick Pt layer was formed as the upper electrode film 22 over the photoresist pattern 21 by RF magnetron sputtering (see FIG. 2(a)). The sputtering condition for the upper electrode film 22 was similar to that for the lower electrode film 12 and was as follows: target of pure Pt; substrate temperature of 250° C.; discharge power of 200 W; sputtering gas of Ar; and pressure of 2.5 Pa. After that, the upper electrode 22' was formed on the KNN thin film pattern 13' by removing the photoresist pattern 21 with acetone cleaning (lift off) (see FIG. 2(b)). Accordingly, the KNN thin film device chip 20 was obtained (see FIG. 2(c)).

In addition, as a standard sample, a 100-nm thick Pt upper electrode film 22 was formed on an unpatterned KNN thin film which was not subjected to the invention's wet etching process. This standard KNN film was not subjected to any etching processes and therefore had no etching damage. The ferroelectric characteristics of the invention's patterned KNN thin films 13' (which were subjected to the invention's wet etching process) were evaluated by comparing to those of this standard sample.

(Measurement of Ferroelectric Characteristics)

Figure 8:
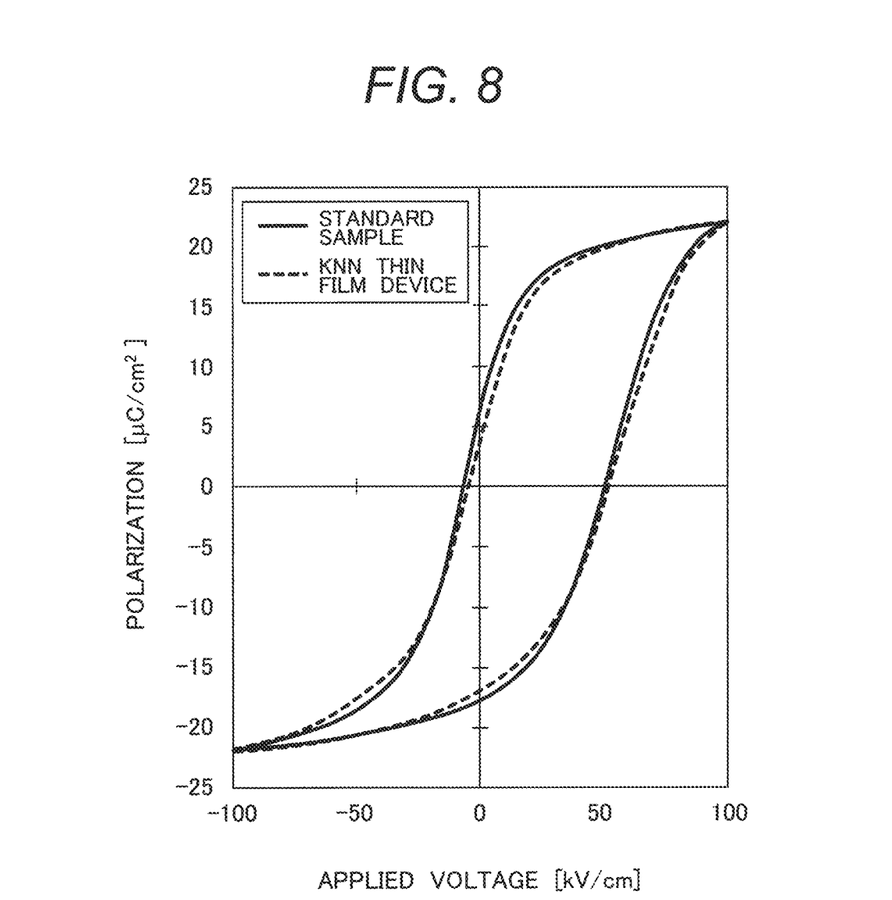
FIG. 8 is a graph showing exemplary relationships between polarization value and applied voltage of a KNN thin film device fabricated according to the invention and a standard sample.

The obtained KNN thin film device chips 20 were measured for the polarization, permittivity, and leakage current density using a ferroelectric characteristics analyzer. FIG. 8 is a graph showing exemplary relationships between the polarization value and the applied voltage of the KNN thin film device fabricated according to the present invention and the standard sample. The KNN thin film device in FIG. 8 was micro-fabricated with an etchant for which EDTMP was used. As shown in FIG. 8, the polarization hysteresis loop of the KNN thin film device fabricated according to the invention almost completely matches that of the standard sample, which means there is no substantial difference in polarization between the two samples.

Difference in the permittivity between the KNN thin film device fabricated according to the invention and the standard sample was as small as about 1%. This degree of difference is within a range of sample to sample variation and measurement error. Thus, there is practically no difference between the two samples. The leakage current difference, too, was within the range of sample to sample variation and measurement error. Again, there is practically no difference between the two samples.

These ferroelectric characteristics measurements demonstrate that ferroelectric thin films can be fine patterned by the invention's etching process without deteriorating their ferroelectric characteristics.

Examination 2

[Lithium Niobate (LN) Thin Film Device]

(Preparation of LN Substrate)

For simplicity of experiment, a single crystalline substrate (10 mm×10 mm×0.5 mm) of lithium niobate ($LiNbO_3$, LN) was prepared. In the same manner as the KNN thin film laminated substrate described above, a photoresist pattern 14 was formed on the LN single crystalline substrate. Then, as an etch mask layer 15, an $SiO_2$ film having a thickness of 500 nm was formed by plasma CVD using a TEOS (tetraethoxysilane) material. Subsequently, an etch mask pattern 15' was formed by a lift-off process.

(Etching Testing and Evaluation of Etching Performance)

As is the case with the KNN thin film device described above, etching testing was conducted, and the etching performance was evaluated. It was observed that an etching performance similar to that of the KNN thin film device was achieved.

Examination 3

[Investigation of Etchant Preparation Method]

With an aim to improve work efficiency in the ferroelectric thin film etching step, the etchant preparation method was investigated. As the ferroelectric thin film to be subjected to etching, a KNN thin film laminated substrate was used as is the case with Examination 1.

(Etching Testing)

Two etchants were prepared, each from 0.4 M of citric acid, 3.5 M of an $NH_3$ aq., and 7.5 M of an $H_2O_2$ aq. by two different methods (the volume was 2 L each). One was prepared by a three-reagent mixing system in which the three reagents were mixed in a single step (hereinafter referred to as Etchant A). The other was prepared by a two-reagent mixing system in which a separately prepared citric acid/ammonia concentrated solution (citric acid of 1.43 M/ammonia of 12.5 M) was added to the $H_2O_2$ aq. (hereinafter referred to as Etchant B).

The time required to mix the reagents was measured for each etchant. For Etchant A, the time from the start of the mixing and stirring of the three reagents to the completion of the melting of the citric acid (visually judged) was approximately 30 minutes. For Etchant B, the time from the start of the mixing and stirring of the two reagents to the completion of the homogenous mixing (visually judged) was approximately 30 seconds.

In the same manner as Examination 1, the KNN thin film was subjected to wet etching using each of Etchant A and Etchant B. The results showed that there was no difference between Etchant A and Etchant B, indicating that they were equal in etching performance. In other words, since there is no difference in etching performance, use of an etchant prepared by the two-reagent mixing system can reduce the time required for the entire etching step (resulting in improving the work efficiency).

Next, another investigation was carried out to verify the preservability of the etchant and the chelating agent/ammonia concentrated solution. An etchant prepared by the two-reagent mixing system and preserved for a week (hereinafter referred to as Etchant B') and another etchant freshly prepared from a citric acid/ammonia concentrated solution that had been preserved for a week (hereinafter referred to as Etchant B") were individually subjected to etching testing.

It was observed that Etchant B' failed to etch the KNN thin film, while Etchant B" exhibited an etching performance that is equivalent to those of Etchant A and Etchant B. Based on this examination 3, it was concluded that the etchant itself should be preferably prepared immediately before the wet-etching process, while the chelating agent/ammonium concentrated solution is excellent in preservability.

The above embodiments and examples of the invention as well as the appended claims and figures show multiple characterizing features of the invention in specific combinations. The skilled person will easily be able to consider further combinations or sub-combinations of these features in order to adapt the invention as defined in the claims to his specific needs.

LEGEND

10 . . . ferroelectric thin film-on-substrate;
11 . . . substrate;
11' . . . diced substrate of chip;
12 . . . lower electrode film;
12' . . . lower electrode in chip;
13 . . . ferroelectric thin film;
13' . . . ferroelectric thin film pattern;
14 . . . photoresist pattern;
15 . . . etch mask layer;
15' . . . etch mask pattern;
20 . . . ferroelectric thin film device;
21 . . . photoresist pattern;
22 . . . upper electrode film; and
22' . . . upper electrode.

The invention claimed is:

1. A method for manufacturing a niobate-system ferroelectric thin film device comprising:
    a lower electrode film formation step of forming a lower electrode film on a substrate;
    a ferroelectric thin film formation step of forming a niobate-system ferroelectric thin film on the lower electrode film;
    an etch mask pattern formation step of forming an etch mask in a desired pattern on the niobate-system ferroelectric thin film;
    an etchant preparation step of preparing an alkaline etchant comprising a predetermined chelating agent, an aqueous alkaline solution and an aqueous hydrogen peroxide solution; and
    a ferroelectric thin film etching step of shaping the niobate-system ferroelectric thin film into a desired fine pattern by wet etching using the alkaline etchant,
    wherein the predetermined chelating agent comprises at least one selected from ethylenediamine tetra(methylene phosphonic acid), nitrilotris(methylene phosphonic acid), cyclohexane diamine tetraacetic acid, 1-hydroxyethane-1,1-diphosphonic acid(etidronic acid), glycine-N,N-bis(methylene phosphonic acid), diethylenetriamine penta(methylene phosphonic acid), and citric acid; and the aqueous alkaline solution comprises an aqueous ammonia solution, and
    wherein the etchant preparation step is a two-liquid mixing process in that a separately prepared concentrated solution containing the predetermined chelating agent and the aqueous alkaline solution is mixed and diluted with the aqueous hydrogen peroxide solution.

2. The method according to claim 1,
    wherein when the predetermined chelating agent is ethylenediamine tetra(methylene phosphonic acid), nitrilotris(methylene phosphonic acid), cyclohexane diamine tetraacetic acid, 1-hydroxyethane-1,1-diphosphonic acid(etidronic acid), glycine-N,N-bis(methylene phosphonic acid), or diethylenetriamine penta(methylene phosphonic acid), the chelating agent in the etchant has a molarity of 0.001 M or more and 0.5 M or less, and
    wherein when the predetermined chelating agent is citric acid, the citric acid in the etchant has a molarity of 0.03 M or more and 1 M or less.

3. The method according to claim 1, wherein the etch mask is made of a silicon oxide film.

4. The method according to claim 1, wherein, at the ferroelectric thin film etching step, the etchant has a temperature of 50° C. or higher and lower than 100° C.

5. The method according to claim 1, wherein the niobate-system ferroelectric thin film is made of potassium sodium niobate or lithium niobate.

6. The method according to claim 1, wherein the lower electrode film is made of platinum.

7. The method according to claim 1, wherein the niobate-system ferroelectric thin film has a device-forming surface on which the niobate-system ferroelectric thin film device is formed; the niobate-system ferroelectric thin film includes one or more crystal grains having a crystal system and crystal planes including a (001) crystal plane; the crystal system of the niobate-system ferroelectric thin film is pseudo cubic or tetragonal; the niobate-system ferroelectric thin film is formed by sputtering in such a manner that the (001) crystal plane of the one or more crystal grains is preferentially oriented parallel to the device-forming surface.

8. The method according to claim 1, wherein the substrate is a silicon substrate having a thermal oxide layer thereon.

9. The method according to claim 1, wherein the method further comprises:
- an upper electrode formation step of forming an upper electrode over a desired fine pattern of the niobate-system ferroelectric thin film; and
- a dicing step of dicing the substrate having thereon the niobate-system ferroelectric thin film having thereon the upper electrode into one or more chips.

* * * * *